(12) United States Patent
Osman et al.

(10) Patent No.: US 7,576,623 B1
(45) Date of Patent: Aug. 18, 2009

(54) AMPLITUDE MODULATION DRIVER

(75) Inventors: Saleh Osman, Cupertino, CA (US);
Darwin De La Cruz, Sunnyvale, CA (US)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/818,802

(22) Filed: Jun. 14, 2007

(51) Int. Cl.
*H03C 3/38* (2006.01)
(52) U.S. Cl. ............... 332/145; 332/146; 332/149; 332/152
(58) Field of Classification Search .......... 332/145–154
See application file for complete search history.

(56) References Cited

U.S. PATENT DOCUMENTS

| | | | | |
|---|---|---|---|---|
| 3,513,405 | A | * | 5/1970 | Carlson ............... 330/277 |
| 6,255,695 | B1 | * | 7/2001 | Kubota et al. ........... 257/351 |
| 2006/0068726 | A1 | * | 3/2006 | Yamawaki ............. 455/126 |

* cited by examiner

*Primary Examiner*—Anh Q Tran

(57) ABSTRACT

A circuit includes a first semiconductor device and a second semiconductor device. The first semiconductor device has a first source region, a first gate region, and a first drain region. The first gate region and the first drain region are separated by a first distance. The second semiconductor device has a second source region, a second gate region, and a second drain region. The second gate region and the second drain region separated by a second distance. The first distance is greater than the second distance.

18 Claims, 5 Drawing Sheets

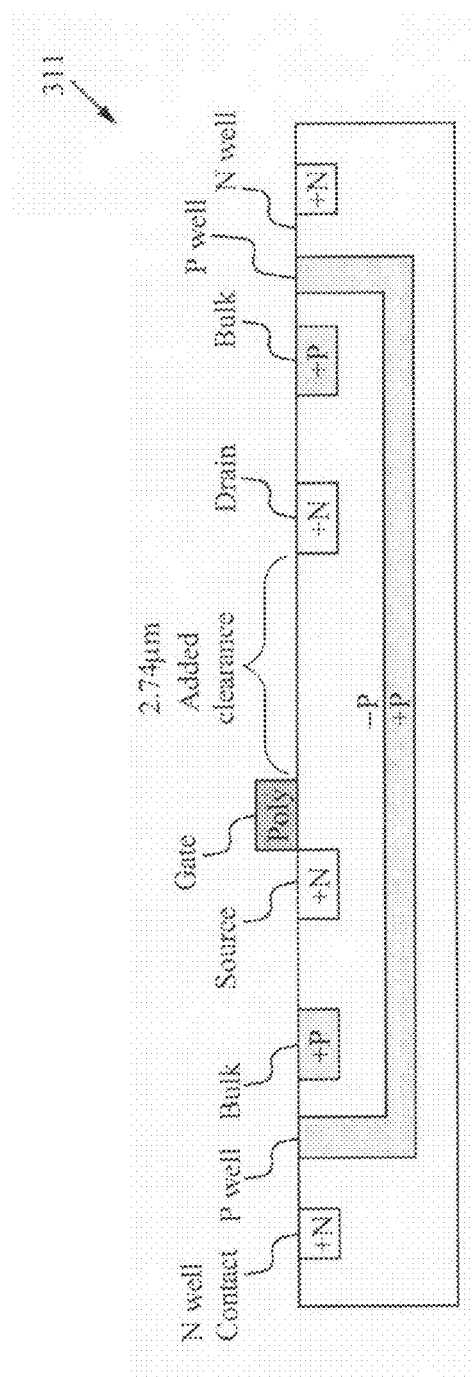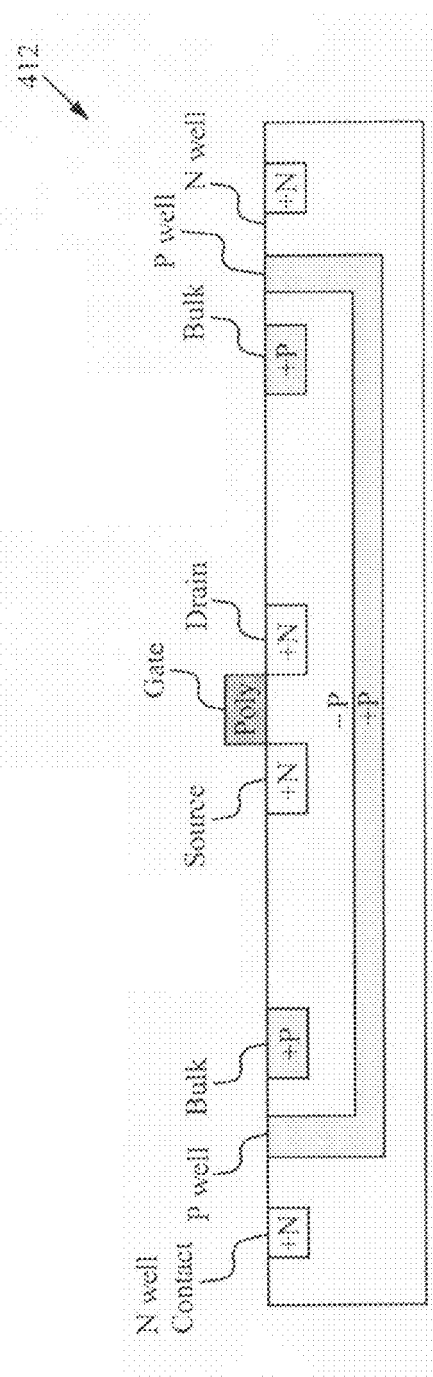

AMPLITUDE MODULATION DRIVER

FIELD OF THE INVENTION

The present invention generally relates to the field of modulation, and is more specifically directed to an amplitude modulation driver.

BACKGROUND

In recent years, researchers have proposed and implemented so called "polar" architectures for the improved transmission of signals. These polar architectures, rather than using complex In-phase Quadrature (IQ) components of a data signal, operate by using the polar coordinates of the data signal. Accordingly, polar implementations of modulation circuitry are used to transmit and receive voice and/or data in the radio frequency (RF) bands of the communications spectrum. Polar implementations have a number of advantages over their IQ-based counterparts.

Regardless of implementation type, modern modulation circuits use transistor devices among their electronic components for the switching of electric current. These transistor devices include bipolar junction transistors (BJT), and metal oxide semiconductors (MOS) such as field effect transistors (MOSFET). These families of transistor devices further include a number of more specific devices, such as, for example, complementary-MOS (CMOS), n-type MOS (NMOS), and p-type MOS (PMOS). Each transistor type has a variety of benefits in implementation.

CMOS-type semiconductors typically are also known to have a voltage drop across a P-N junction. The P-N junction is responsible in part for the particular properties of that transistor. During usual transistor device operation, typical voltage drops are on the order of approximately 1.0 volt or less.

However, conditions arise in which a greater than expected voltage is applied across the P-N junction of a transistor, such as periods of high power supply charge, electrostatic discharge (ESD) events, and/or other high voltage conditions. During these higher voltage conditions, the properties of the P-N junction change such that the transistor device "breaks down" or fails in operation. For example, the increased voltage causes an undesirable amount of electron tunneling and/or positive charge holing, across the P-N junction.

SUMMARY OF THE INVENTION

A circuit includes a first semiconductor device and a second semiconductor device. The first semiconductor device has a first source region, a first gate region, and a first drain region. The first gate region and the first drain region are separated by a first distance. The second semiconductor device has a second source region, a second gate region, and a second drain region. The second gate region and the second drain region are separated by a second distance. The first distance is greater than the second distance.

Preferably, the circuit is coupled to a transceiver that includes an amplitude modulator, an envelope modulator, and a power amplifier. The transceiver of some embodiments further includes a phase modulator, such that the transceiver is a polar transceiver. Typically, the first semiconductor device has a larger voltage drop than the second semiconductor device. The first semiconductor device also generally has a higher tolerance to voltage fluctuations. The first gate region often comprises a polycrystalline silicon material. The first semiconductor device is usually an NMOS type semiconductor device.

In some implementations, a drain lead of the first semiconductor device is coupled to an input voltage, a source lead of the first semiconductor device is coupled to a drain lead of the second semiconductor device, and a drain lead of the second semiconductor device is coupled to a low voltage, such that the first semiconductor device and the second semiconductor device are stacked.

The circuit of some embodiments further includes a third semiconductor device and/or a fourth semiconductor device. The third semiconductor device has a gate lead that is coupled to a signal input. The fourth semiconductor device couples the first, second, and third semiconductor devices to a power amplifier. The power amplifier is for outputting a modulated signal. In a particular implementation, the third semiconductor device is a PMOS type transistor, and the fourth semiconductor device is a BJT type transistor.

BRIEF DESCRIPTION OF THE DRAWINGS

The novel features of the invention are set forth in the appended claims. However, for purpose of explanation, several embodiments of the invention are set forth in the following figures.

FIG. 3 illustrates a cross section view of a transistor device, in accordance with some embodiments of the invention.

FIG. 4 illustrates a cross section view of a more conventional transistor device.

DETAILED DESCRIPTION

In the following description, numerous details and alternatives are set forth for purpose of explanation. However, one of ordinary skill in the art will realize that the invention can be practiced without the use of these specific details. In other instances, well-known structures and devices are shown in block diagram form in order not to obscure the description of the invention with unnecessary detail.

Figure 1:
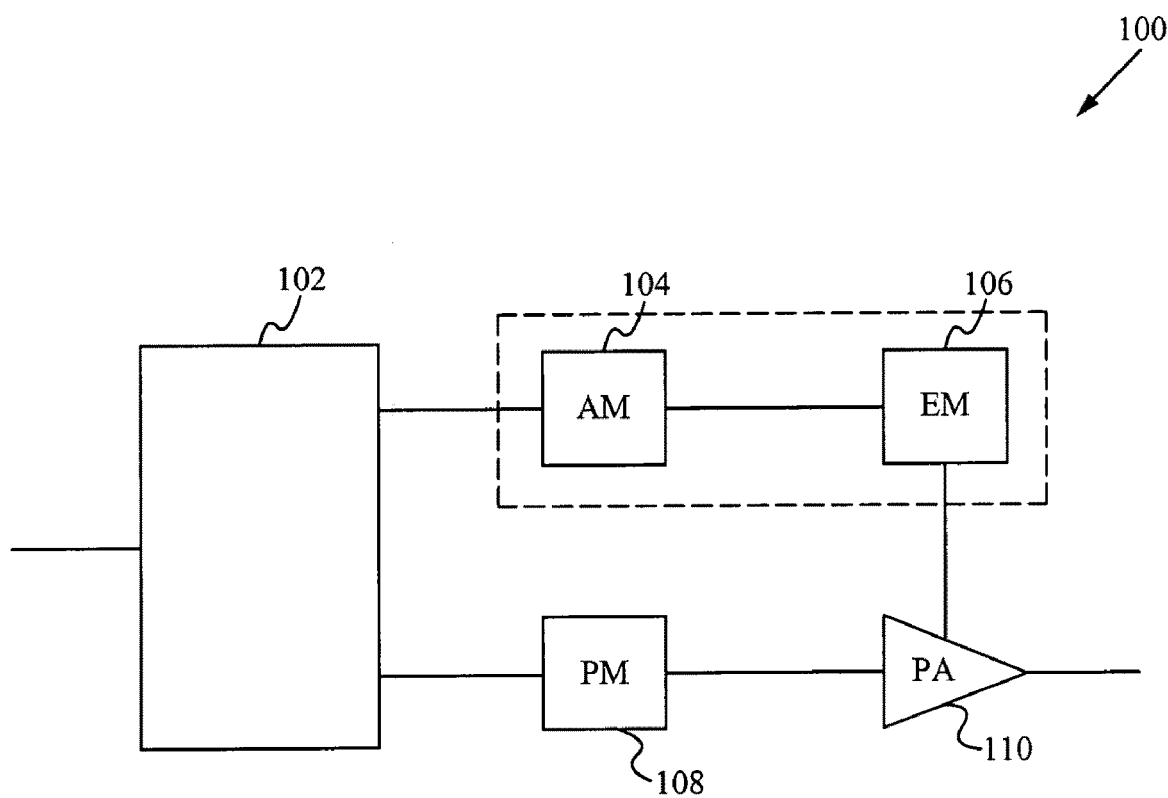
FIG. 1 illustrates an amplitude modulator for a polar modulation system.

FIG. 1 illustrates a polar transmitter 100. As shown in this figure, the transmitter 100 includes an input signal module 102 coupled to an amplitude modulator 104. The amplitude modulator 104 is coupled in turn to an envelope modulator 106, which is coupled to a power amplifier 110. The input signal module 102 typically includes circuitry for the handling and/or conversion of a polar modulation signal, for example.

The input signal module 102 is also coupled to a phase modulator 108, which is coupled to the power amplifier 110. The path through the amplitude modulator 104 forms an amplitude modulation (AM) path, while the path through the phase modulator 108 forms a phase modulation (PM) path. In these transmitter architectures, the amplitude modulator 104 requires an interface with a battery supply ($V_{BAT}$) for the power amplifier (PA) 110, as illustrated in further detail in FIG. 2.

Figure 2:
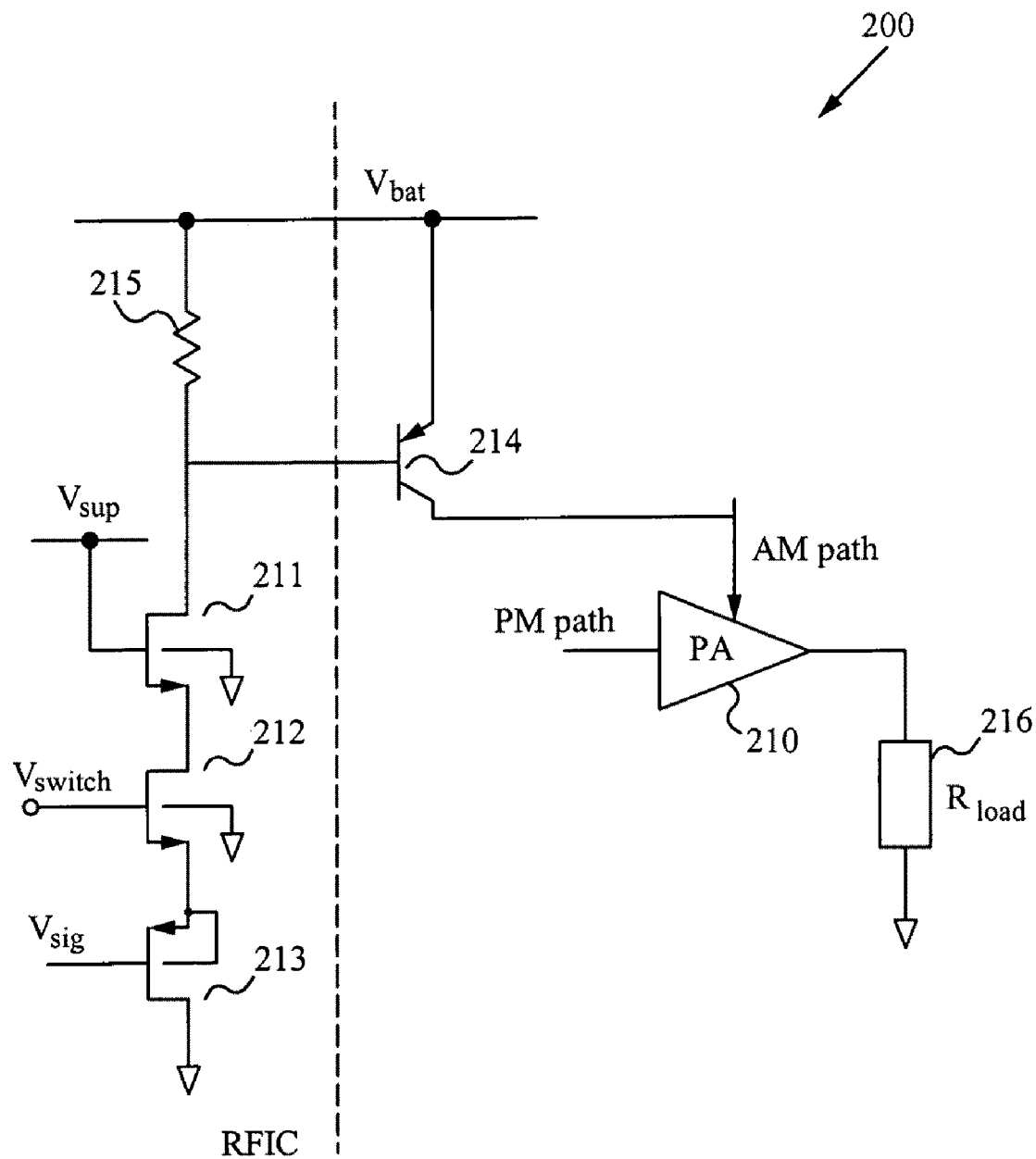
FIG. 2 illustrates a portion of a radio frequency integrated circuit of an envelope modulator.

FIG. 2 illustrates a portion of an envelope modulator such as the envelope modulator 106 described above in relation to FIG. 1. As shown in this figure, the circuit 200 includes a voltage $V_{BAT}$ coupled in series to the drain lead of a transistor 211, through a resistor 215. The voltage $V_{BAT}$ is typically provided by a battery, for example, or another suitable power source. The source lead of the transistor 211 is coupled in series to the drain lead of a transistor 212. The source lead of the transistor 212 is coupled to the source lead of a transistor 213. The drain lead of the transistor 213 is coupled to a low voltage, such as ground.

As shown in the figure, the transistors 211 and 212 are preferably NMOS type semiconductor devices, while the transistor 213 is preferably a PMOS type semiconductor device. Accordingly, the gate lead of the transistor 211 is coupled to a voltage from the modulation circuitry $V_{SUP}$, and the gate lead of the transistor 212 is coupled to a voltage from control logic $V_{SWITCH}$, which allows the circuit to be turned on and off. The gate lead of the transistor 213 is coupled to a voltage provided by an input signal $V_{SIGNAL}$.

As illustrated in FIG. 2, in some embodiments, the foregoing components form a portion of a radio frequency integrated circuit (RFIC), which is coupled to the base lead of a transistor 214 at a node coupling the resistor 215 to the drain lead of the transistor 211. When the resistor 215 is within the RFIC, direct measurement of the base to emitter voltage $V_{BE}$ of the transistor 214 is facilitated. In other embodiments, the resistor 215 is outside of the RFIC such that the transistor 211 is an open drain output and only one connection is necessary to complete the drive circuit to the transistor 214. Preferably, the transistor 214 is a PNP type bipolar junction transistor (BJT), with its emitter lead coupled to the voltage line $V_{BAT}$. The collector lead of the transistor 214 is coupled to an input of the power amplifier 210. The transistor 214 is typically part of the envelope modulator, and acts as a pass transistor for the amplitude modulation path.

The power amplifier 210 also receives input from the phase modulation path, and provides an output to a load resistance 216 ($R_{LOAD}$). In operation, the transistor 211 sinks current from the pass transistor 214 in the amplitude modulation path, as the current flows through the drain lead of the transistor 211. Separately, the transistor 212 is used as a switch to deactivate the signal path from the transistor 213.

One of ordinary skill recognizes that a high voltage across the transistor devices illustrated in FIG. 2, particularly the transistor 211, can undesirably affect the operation of the circuit 200. Hence, some embodiments advantageously employ thick oxide devices that are less vulnerable to high voltages, such as through electrostatic discharge (ESD), for example. Alternatively, or in conjunction with these embodiments, the bipolar type semiconductor devices optionally apply a selective collector implant, which makes the junction of these devices more tolerant to larger voltage transitions. Moreover, embodiments of the invention stack the semiconductor devices as illustrated in FIG. 2, to minimize the incidence of transistor break down at the transistor junction.

For instance, when the transistor devices illustrated in FIG. 2 comprise standard bulk three volt (3.3V) CMOS type semiconductors, these devices have an undesirable risk of break down due to the input supply voltage through the line $V_{BAT}$, as described above. The voltage $V_{BAT}$ often rises as high as about 5.0 volts, or more, when the battery supplying power to the transmitter device is charging and/or is fully charged.

However, the use of the NMOS, PMOS, and/or the BJT type devices illustrated in FIG. 2 represents an advantageous cost savings. Hence, additional process steps and/or protection circuitry for higher power conditions and/or events, are not desirable in this area, as additional steps and/or circuitry undesirably reduce the cost saving advantages of the illustrated implementation. Moreover, available head room within the integrated circuit must instead maximize the signal dynamic range.

FIG. 3 illustrates a cross section view of the transistor device 311 of some embodiments of the invention. As shown in FIG. 3, the transistor 311 includes source, gate, and drain regions for each of the source, gate, and drain leads of the transistor 311. Typically, the gate region comprises a polycrystalline silicon material. When the transistor 311 is an NMOS type device, the source and drain regions are formed by using a +N, or n-channel enhancement mode type material. As shown in the figure, the drain region is advantageously separated from the gate and source regions by a –P, or p-channel type material. More specifically, the p-channel type material separating the drain region from the other regions of the transistor, is enlarged to include an added clearance. The added clearance of some embodiments is about 2.74 micrometers (μm) in size. The added clearance increases the ability of the transistor 311 to tolerate voltage fluctuations, such as by increasing the ability of the P-N junction to function properly without breaking down.

The drain region of the transistor 311 of FIG. 3, is capable of reaching the full input voltage $V_{BAT}$ at minimum amplitude modulation, as the base lead of the transistor 214 (illustrated in FIG. 2) is pulled up by the resistor 215 (of FIG. 2) during operation of the circuit 200 employing such a transistor 311 of FIG. 3. Hence, as shown in FIG. 3, the transistor 311 is preferably a wide band three volt device, having a thick oxide region with increased tolerance to higher voltage at its drain region. Moreover, use of the transistor 311 in the circuit 200 requires no other modification of the circuit 200, and does not substantially affect the cost of manufacture and/or implementation of the transistor device 211 and the circuit 200 of FIG. 2.

In some implementations, the transistor 212 in the circuit 200 of FIG. 2, does not have the same increased voltage tolerance requirements as the transistor 211. FIG. 4 illustrates a cross section view of a more conventional transistor device 412, that is preferably employed in these implementations. As shown in FIG. 4, the transistor 412 includes source, gate, and drain regions. As described above, the source and drain regions typically comprise a +N, n-channel type material, for an NMOS type semiconductor device. In these devices, a –P, p-channel type material separates the source and drain regions, beneath the gate region of the transistor 412. However, this p-channel type material preferably occupies a smaller distance from the source region to the drain region of the transistor 412 of FIG. 4, than in the transistor 311 of FIG. 3. Hence, the transistor 412 performs more conventionally in operation, than the transistor 311. As mentioned above, the added clearance between the gate and drain regions in the transistor 311 of FIG. 3 measures about 2.74 micrometers (μm) in distance greater than the transistor 412 of FIG. 4. The added clearance increases the ability of the transistor 311 to tolerate voltage fluctuations, such as by increasing the ability of the P-N junction to function properly without breaking down.

Figure 5:
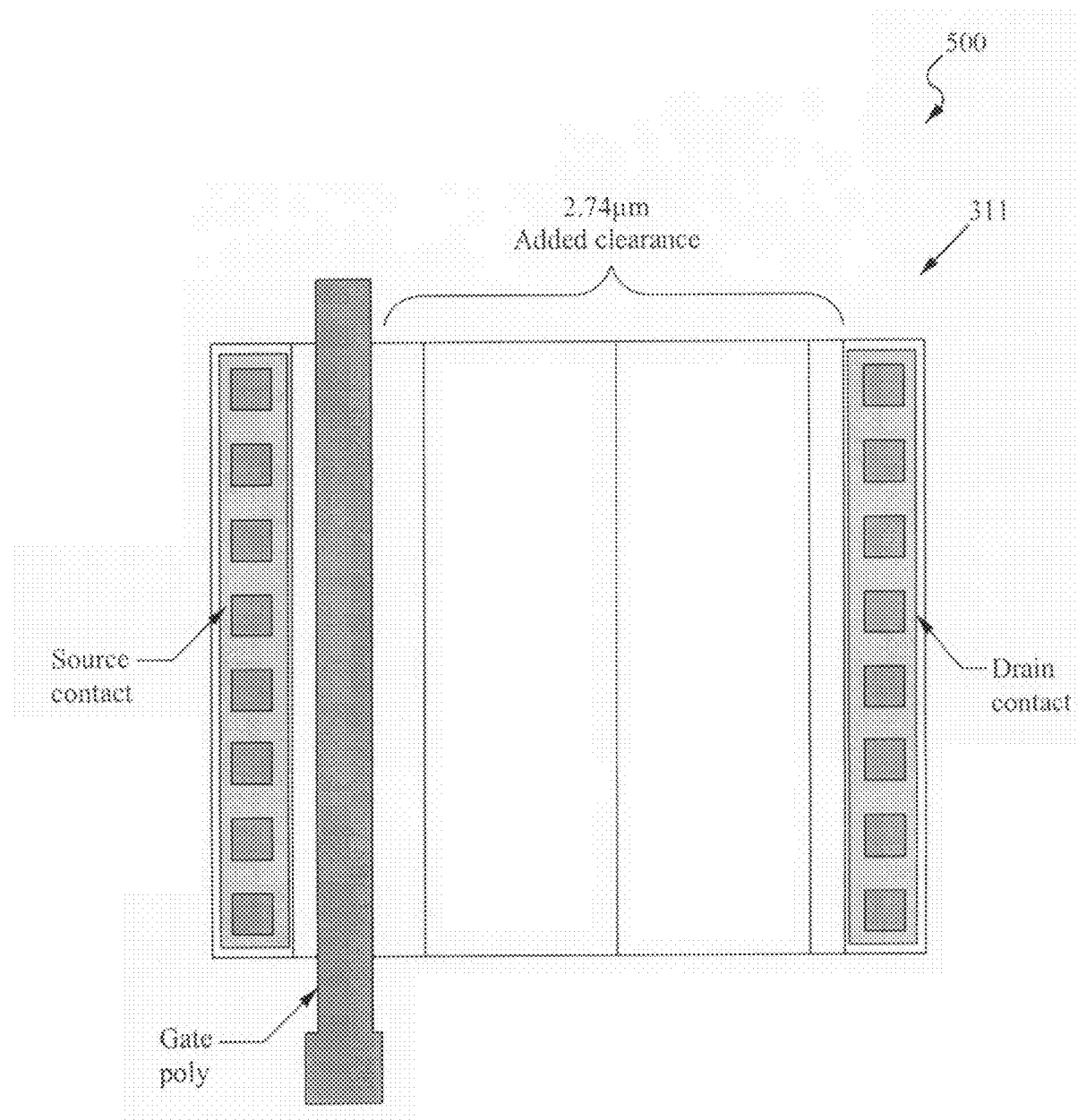
FIG. 5 illustrates a plan view of the transistor device of FIG. 3.

FIG. 5 illustrates a plan view 500 of the transistor device 311 of FIG. 3. As emphasized in further detail in FIG. 5, the drain region of the transistor 311 is advantageously located further away from the polycrystalline silicon material of the gate region, thereby minimizing the effect of an electric field at the drain-to-gate junction of the transistor 311.

Figure 6:
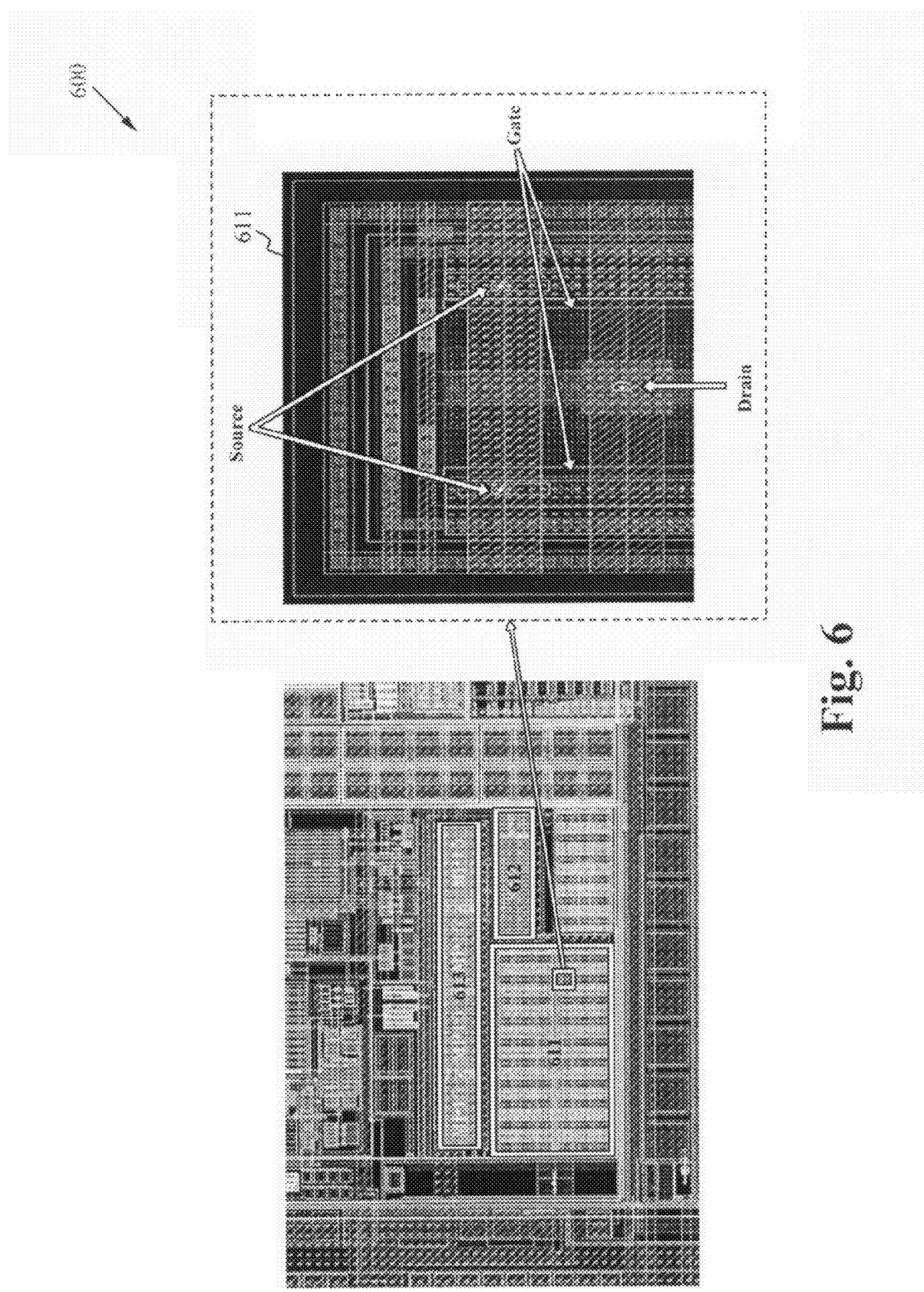
FIG. 6 illustrates the plan view of FIG. 5 as an exploded view of an integrated circuit in accordance with embodiments of the invention.

FIG. 6 illustrates the plan view of FIG. 5 as an exploded view of an integrated circuit 600 in accordance with embodiments of the invention. As shown in this figure, the bulk nodes of both the transistors 611 and 612 are separated from source diffusion, as is preferred. Further, the source, gate, and drain regions are labeled in the figure, and the connection of the bulk nodes is star routed to ground.

The foregoing embodiments have particular implementation advantages for an amplitude modulator circuit, such as the amplitude modulation path of a polar transceiver, for example. In the polar transceiver, an input signal is preferably divided into polar components that are used separately by an amplitude modulation path and a phase modulation path. Then, the signal components are combined at a power amplifier to generate a modulated signal. The power amplifier of a particular embodiment has seven stages, for example. In this embodiment, the stages include a driver stage such as a DC driver, for example.

As mentioned above, the amplitude modulation path of some embodiments includes an envelope modulator that uses a simple, low cost, discreet device, such as, for example, a bipolar junction PNP type transistor (BJT). This BJT transistor is coupled to a power source, such as a battery voltage. In some implementations, the power source typically delivers about 4.7 volts, and the voltage drop across the BJT transistor is about 0.7 volts. Hence, the voltage at the collector output of this transistor is at least about 4.0 volts. The BJT transistor is typically located near the boundary of a radio frequency integrated circuit (RFIC) having the envelope modulator. Hence, the BJT is preferably coupled to a set of stacked MOS transistors located within the RFIC. As described above, these MOS transistors include n-type and/or p-type semiconductors that are coupled to control and/or signal inputs.

Conventionally, for the implementations described above to handle fluctuations of higher voltages such as up to about 8.0 volts, the modulation circuitry requires two sets of devices to include a set of standard rated devices that handle up to 3.3 volts, for example, as well as devices that handle up to 8.0 volts, for example. The additional devices are a little slower, and undesirably require extra steps in the modulation process to support them.

In contrast, some embodiments of the invention use a combination of stacked devices and/or a fundamental modification of the structure of one or more semiconductor devices within the stacked devices. The modification alters the properties of the device such that the device advantageously provides a more robust implementation for the modulation circuit, that includes greater tolerance to higher voltage potentials, such as during charging and/or discharging.

Preferably, for the modulation circuitry described above, only the junction at the device 212 in FIG. 2 requires modification to achieve the desired performance advantages. For example, a modification of the device 212 of FIG. 2, allows the circuit 200 to tolerate a battery voltage jump of up to about 5.0 volts, or more, such as when the input power supply is charging, and/or is fully charged. As illustrated in FIG. 3, some embodiments employ an extra clearance for an NMOS type device, such as the device 311 illustrated therein. However, one of ordinary skill recognizes implementations that employ other modifications to alternative semiconductor devices.

While the invention has been described with reference to numerous specific details, one of ordinary skill in the art will recognize that the invention can be embodied in other specific forms without departing from the spirit of the invention. For instance, the embodiments above have been described by reference to polar modulation circuitry, bipolar junction, and/or metal oxide semiconductor type devices. However, implementations in other types of circuits and/or by using alternative devices, are contemplated as well. Thus, one of ordinary skill in the art will understand that the invention is not to be limited by the foregoing illustrative details, but rather is to be defined by the appended claims.

What is claimed is:

1. A circuit comprising:
an amplitude modulation path coupled to a first input of a power amplifier;
a first semiconductor device coupled to sink current flowing through the amplitude modulation path, the first semiconductor device comprising a first source region, a first gate region, and a first drain region, the first gate region and the first drain region separated by a first distance; and
a second semiconductor device comprising a second source region, a second gate region, and a second drain region, the second gate region and the second drain region separated by a second distance;
wherein the first distance is greater than the second distance and the first semiconductor device is coupled to the second semiconductor device.

2. The circuit of claim 1, wherein the first semiconductor device comprises a larger voltage drop than the second semiconductor device.

3. The circuit of claim 1, wherein the first semiconductor device comprises an increased tolerance to voltage fluctuations.

4. The circuit of claim 1, wherein the first gate region comprises a polycrystalline silicon material.

5. The circuit of claim 1, wherein the first semiconductor device comprises an NMOS type semiconductor device.

6. A circuit comprising:
a first semiconductor device comprising a first source region, a first gate region, and a first drain region, the first gate region and the first drain region separated by a first distance;
a second semiconductor device comprising a second source region, a second gate region, and a second drain region, the second gate region and the second drain region separated by a second distance, wherein the first distance is greater than the second distance;
an input voltage line;
a drain lead of the first semiconductor device coupled to the input voltage line;
a source lead of the first semiconductor device coupled to a drain lead of the second semiconductor device; and
a drain lead of the second semiconductor device coupled to a low voltage,
such that the first semiconductor device and the second semiconductor device are stacked.

7. A circuit comprising:
a first semiconductor device comprising a first source region, a first gate region, and a first drain region, the first gate region and the first drain region separated by a first distance;
a second semiconductor device comprising a second source region, a second gate region, and a second drain region, the second gate region and the second drain region separated by a second distance, wherein the first distance is greater than the second distance and the first semiconductor device is coupled to the second semiconductor device;
a signal input;
a third semiconductor device;
a gate lead of the third semiconductor device coupled to the signal input, and
a fourth semiconductor device coupling the first, second, and third semiconductor devices to a power amplifier, the power amplifier for outputting a modulated signal.

8. A polar modulator comprising:
a power amplifier for outputting a modulated signal;
an envelope modulator coupled to a first input of the power amplifier;
an amplitude modulator coupled to the envelope modulator, the amplitude modulator and the envelope modulator forming an amplitude modulation path;
a first semiconductor device coupled to sink current flowing through the amplitude modulation path, the first semiconductor device comprising a first source region, a first gate region, and a first drain region, the first gate region and the first drain region separated by a first distance; and
a second semiconductor device coupled to first semiconductor device as a switch to deactivate a signal path in the first semiconductor device, the second semiconductor device comprising a second source region, a second gate region, and a second drain region, the second gate region and the second drain region separated by a second distance;
wherein the first distance is greater than the second distance and the first semiconductor device is coupled to the second semiconductor device.

9. The polar modulator of claim 8, wherein the polar modulator is coupled to a transceiver circuit, the transceiver circuit for selectively transmitting and receiving a message signal.

10. The polar modulator of claim 9, the transceiver circuit further comprising a set of polar coordinates.

11. The polar modulator of claim 8, wherein the first semiconductor device comprises a larger voltage drop than the second semiconductor device.

12. The polar modulator of claim 8, wherein the first semiconductor device comprises an increased tolerance to voltage fluctuations.

13. The polar modulator of claim 8, wherein the first gate region comprises a polycrystalline silicon material.

14. The polar modulator of claim 8, wherein the first semiconductor device comprises an NMOS type semiconductor device.

15. The polar modulator of claim 8, further comprising:
an input power line;
a drain lead of the first semiconductor device coupled to the input power line;
a source lead of the first semiconductor device coupled to a drain lead of the second semiconductor device, and
a drain lead of the second semiconductor device coupled to a low voltage,
such that the first semiconductor device and the second semiconductor device are in a stacked configuration.

16. The polar modulator of claim 8, further comprising:
a signal input;
a third semiconductor device, a gate lead of the third semiconductor device coupled to the signal input within the signal path; and
a fourth semiconductor device coupling the first, second, and third semiconductor devices to a power amplifier, the power amplifier for outputting a modulated signal, wherein the first semiconductor device is coupled to the fourth semiconductor device to sink current flowing through the fourth semiconductor device.

17. An amplitude modulation driver comprising:
an envelope modulator coupled to a first input of the power amplifier;
an amplitude modulator coupled to the envelope modulator the amplitude modulator and the envelope modulator forming an amplitude modulation path;
a first semiconductor device coupled to sink current flowing through the amplitude modulation path, the first semiconductor device comprising a first source region, a first gate region, and a first drain region, the first gate region and the first drain region separated by a first distance;
a second semiconductor device comprising a second source region, a second gate region, and a second drain region, the second gate region and the second drain region separated by a second distance;
wherein the first distance is greater than the second distance and the first semiconductor device is coupled to the second semiconductor device.

18. The amplitude modulation driver of claim 17, wherein the first semiconductor device and the second semiconductor device are within a radio frequency integrated circuit (RFIC), wherein a gate lead of the second semiconductor device is coupled to a switching voltage.

* * * * *